United States Patent [19]

Kim

[11] Patent Number: 5,774,028
[45] Date of Patent: Jun. 30, 1998

[54] SURFACE MOUNT LINE FILTER WITH SOLDER GAS DISCHARGE PATHS IN THE CORE

[75] Inventor: Chang Sik Kim, Kyongki-do, Rep. of Korea

[73] Assignee: Samsung Electro-Mechanics, Kyongki-do, Rep. of Korea

[21] Appl. No.: 657,260

[22] Filed: Jun. 3, 1996

[30] Foreign Application Priority Data

Jun. 7, 1995 [KR] Rep. of Korea ................... 1995-14961

[51] Int. Cl.[6] ................................................... H03H 7/09
[52] U.S. Cl. ............................ 333/181; 333/185; 336/65; 336/192
[58] Field of Search ............................ 336/65, 175, 192; 333/181, 185

[56] References Cited

U.S. PATENT DOCUMENTS

| | | | |
|---|---|---|---|
| 4,543,554 | 9/1985 | Muellenheim et al. | 333/181 X |
| 4,845,452 | 7/1989 | Sasaki et al. | 333/185 X |
| 5,321,373 | 6/1994 | Shusterman et al. | 333/181 X |
| 5,455,552 | 10/1995 | Metsler | 333/185 X |

FOREIGN PATENT DOCUMENTS 63-214013  9/1988  Japan .

*Primary Examiner*—Robert Pascal
*Assistant Examiner*—Justin P. Bettendorf
*Attorney, Agent, or Firm*—Lowe Hauptman Gopstein & Berner

[57] ABSTRACT

A line filter for a surface mounting device which eliminates noise on a power supply line, and more particularly a line filter for a surface mounting device in which not only a making to mount is easy because a magnitude of the filter is made to be small, but also a noise eliminating characteristic is improved better. The technical construction of the present invention is made such that three capacitor elements are mounted side by side to the capacitor mounting portion formed at top surface of the ferrite core, lead wires are inserted through the lead wire passing through openings among three capacitor elements mounted to the ferrite core, the ground terminal portion is formed by printing to both side surfaces of the ferrite core, and said capacitor, lead wires and ground terminal portion are connected by soldering and then the surface is coated; therefore, there are effects that a surface mounting is easy and a noise eliminating characteristic is excellent.

9 Claims, 5 Drawing Sheets

SURFACE MOUNT LINE FILTER WITH SOLDER GAS DISCHARGE PATHS IN THE CORE

BACKGROUND OF THE INVENTION

The present invention relates to a line filter for a surface mounting device which eliminates noise on power supply line, and more particularly to a line filter for a surface mounting device in which the size of the filter is small whereby an occupying space is reduced and a noise eliminating characteristic can be improved.

In general, when a filter is classified by function, it is classified as a low pass filter (LPF) for passing only a low band, a high pass filter (HPF) for passing only a high band, a band pass filter (BPF) for passing only an any particular band, and a band restricting filter (BRF), and when it is classified by its constituting element, it is classified as a passive filter made by combining a coil, capacitor and resistor being a passive element, and an active filter made by using a transistor being an active element and a capacitor and resistor being a passive element.

At an oscillating process of magnetron used at a large scale power electromagnetic appliance such as a broadcasting instrument or a microwave oven, many frequencies are incidentally generated as noises, and because such noises are induced to a set through the power supply line or radiated to space whereby making a noise and error operation to a circumferential appliance, the line filter which belongs to a low pass filter as a classification in accordance with said function and which belongs to a passive filter as a classification in accordance with the constituting element is provided for eliminating them.

For a conventional line filter, T-type line filter and n-type line filter are used, and the T-type line filter has a configuration which is connected to a bypass capacitor to a serially connected coil, and in case of conventional line filter, since it has a problem that an attenuating characteristic is excellent at a particular frequency but not as a wide band filter, n-type filter an is widely used. The n-type line filter has a configuration which is connected to bypass capacitors on both sides of a coil, and since the capacitors and the coil elements are respectively divided at a predetermined distance, a filtering characteristic is inferior because of its connecting configuration and circuit configuration.

And, since such a conventionally used line filter was individually constituted by the constituent parts, its size becomes bigger whereby mounting becomes impossible, and since the distance among the respective constituent parts become more distant and accordingly lead wires between the constituent parts become longer, there has been a problem that a noise eliminating characteristic becomes decreased due to an accompanying impedance on lead wire.

On the other hand, Japanese laid open patent publication sho-63-214013 (Title: T-type LC filter) is shown in FIG. 6 and FIG. 7. FIG. 6 is an exploded perspective view showing a part of a conventional filter assembly. FIG. 7 is a cross sectional view showing an assembled state of a conventional filter assembly.

The construction of conventional filter shown in FIG. 6 and FIG. 7 is constructed by a magnetic body block 42 including first, second and third pierced through holes 48, 49, 50 defined to be pierced through at another side circumferential surface 42a confronting to one side circumferential surface 42a, a capacitor 43 including a pair of electrodes and connected with a lead 54 to at least one side of this one pair of electrodes 52, 53, and first and second inductance leads 57, 58 which are electrically connected to other side of a pair of the electrodes 52, 53 of the capacitor 43, and in which the capacitor 43 is inserted to the first pierced through hole 48 so that the lead 54 of the capacitor 43 is projected at other side circumferential surface 42b of the magnetic body block 42, and the first and second inductance leads 57, 58 are inserted to the second and third pierced through holes 49, 50 so as to direct from one circumferential surface 42a of the magnetic body block 42 to other side circumferential surface 42b and to other side electrode 53 of the capacitor 43, so that front ends of the first and second inductance leads 57, 58 are projected at the other side circumferential surface 42b.

In accordance with the conventional T-type LC filter constructed as this, since a multiplicity of pieced through holes being different in their magnitudes are defined to the magnetic body block, and a lead provided with capacitor is provided at center portion of flat portion of the lead wire, a difficulty is accompanied in assembling and manufacturing on construction, and entire structure of the filter is complicated such as that a capacitor should be firmly fixed to an exact position to be accorded with the pierced through hole at top of the inductance lead wire.

Further, in accordance with the conventional filter, in case of doing a surface mounting to the mounting board, as shown in FIG. 7, the lead is to be soldered, but since there is not an adequate method for discharging a gas produced upon this soldering moment, there has been a problem that the conventional surface mounting becomes unstable.

OBJECT AND SUMMARY OF THE INVENTION

The present invention is invented to solve such problem as above.

Therefore, it is an object of the present invention to provide a line filter for a surface mounting device in which mounting can be easily executed due to the size of the line filter being greatly reduced.

Another object of the present invention is to provide a line filter for a surface mounting device which effectively improves a noise eliminating characteristic which may be induced to as set along with the power supply line such as common noise and normal noise.

As a means for attaining the objects as above, the line filter for a surface mounting device comprises:

a ferrite core having a top side and a bottom side and a capacitor mounting portion formed in a top thereof, and lead wires' openings extending from the top side to the bottom side, the ferrite core having a plurality of gas discharge paths extending from a surface of the ferrite core to each of the pairs of openings;

a multiplicity of capacitor elements each mounted in the mounting portion of the ferrite core and each spaced a distance apart;

pairs of lead wires each having a pair of legs and a connecting portion connecting the pair of legs, the pair of legs extending through a corresponding pair of openings in the ferrite core, each of the connecting portions being mounted between two of the multiplicity of capacitor elements;

a soldering portion fixing the capacitors, lead wires; and an epoxy coating portion coating a surface of the soldering portion.

DETAILED DESCRIPTION OF THE INVENTION

Hereinafter, the present invention will be described more in detail with reference to the accompanying drawings.

Figure 1:
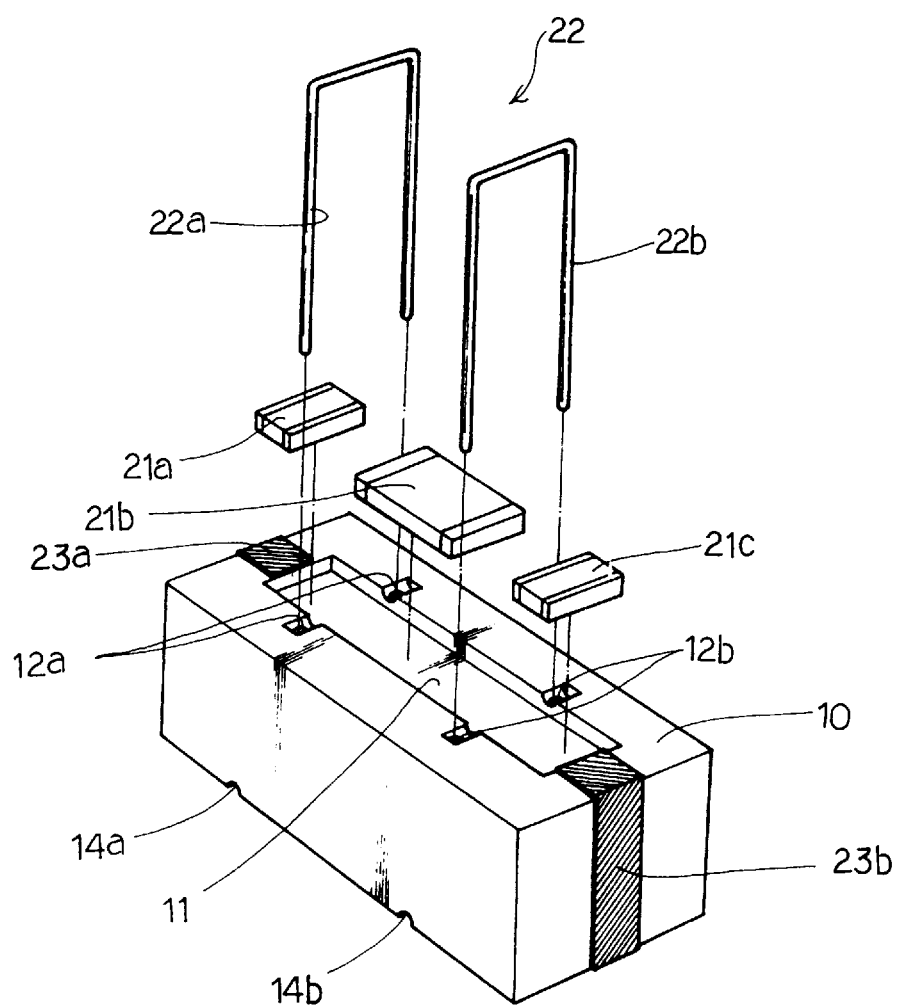
FIG. 1 is a perspective view showing an exploded state of a line filter for a surface mounting device in accordance with the present invention.
Figure 2:
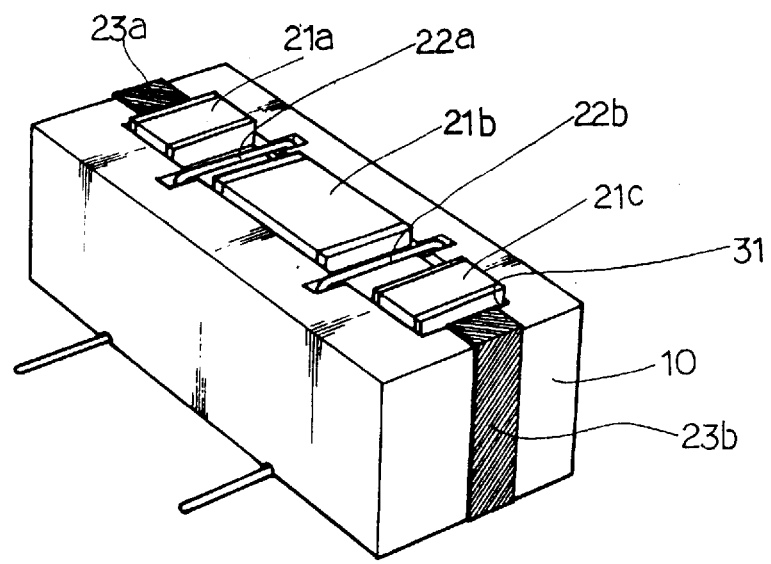
FIG. 2 is a perspective view showing an assembled state of the line filter for a surface mounting device in accordance with the present invention.
Figure 3:
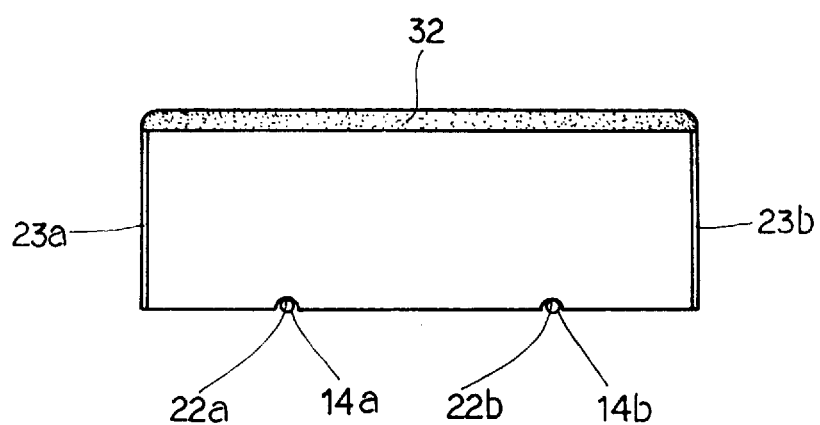
FIG. 3 is a plane view of the line filter for a surface mounting device completed a manufacture in accordance with the present invention.

FIG. 1 is a perspective view showing an exploded state of a line filter for a surface mounting device in accordance with the present invention, FIG. 2 is a perspective view showing an assembled state of a line filter of a surface mounting device in accordance with the present invention, and FIG. 3 is a front view of a line filter of a surface mounting device in accordance with the present invention.

In FIG. 1 to FIG. 3, the line filter for a surface mounting device comprises: a ferrite core 10 including lead wire passing through openings 12a, 12b, 12c, 12d made of pair which are formed to be pierced through from top side to bottom side along a capacitor mounting portion 11 formed to a predetermined portion of the top surface and a multiplicity of capacitor elements 21a, 21b, 21c to be mounted to the capacitor mounting portion 11; a multiplicity of capacitor elements 21a, 21b, 21c mounted by taking away a predetermined distance within the capacitor mounting portion 11 of the ferrite core 10; lead wires 22a, 22b in which both front ends are inserted from top side to bottom side through the lead wire passing through openings 12a, 12b, 12c, 12d made of pair of the ferrite core and thereby made to be input and output terminals; ground terminal portions 23a, 23b formed by printing with conductive paste to both side surfaces of the ferrite core 10; a soldering portion 31 fixed and formed by soldering the capacitor elements 21a, 21b, 21c, lead wires 22a, 22b and the ground terminal portions 23a, 23b; and an epoxy coating portion 32 formed by epoxy-coating the surface of the soldering portion 31 of top side of the ferrite core.

The ferrite core 10 is a soft magnetic material exhibiting a ferromagnetism, and its external shape is not particularly limited, but in an embodiment of the present invention, it is made of a small sized rectangular column shape being approximately 10 mm×5 mm×5 mm (width×length×height), and it should be understood that it can be made to other shapes including cylindrical shape. And, the ferrite core 10 is made by $Fe_2O_3$, NiO, ZnO as major ingredients, and other major ingredients may be $Fe_2O_3$, NiO, ZnO, CuO, or $Fe_2O_3$, NiO, ZnO, DuO, CoO, or FeO, NiO, ZnO, MgO.

And, the capacitor mounting portion 11 formed at top surface of the ferrite core 10 is preferable to make such that the top surface of the capacitor elements 21a, 21b, 21c mounted to the top surface of the ferrite core 10 forms a flat surface in case when the capacitor elements 21a, 21b, 21c are mounted to the capacitor mounting portion 11 in order to do a smooth coating process after soldering.

FIGS. 4(A), 4(B) and 4(C) are rear views showing various changed type embodiments for gas discharging paths 14, 14a, 14b of the line filter for a surface mounting device in accordance with the present invention.

Referring FIGS. 4(A), 4(B) and 4(C), they are those which formed the ground terminal portions 23a, 23b by printing a conductive paste on the electrode terminal portions 13a, 13b of the ferrite core 10, and these ground terminal portions 23a, 23b are formed to wider area than the lead wire by considering the bypass characteristic.

At least one gas discharging path(s) including the lead passing openings 12a, 12b, 12c, 12c are formed to bottom surface of the ferrite core 10, for example, it can be formed to breadth-wise direction as FIG. 4(A) corresponding to the line form, or it can be formed to lengthwise direction as FIG. 4(B), and it is possible to form a gas discharging path 14 as FIG. 4(C) corresponding to an area form.

And, as a conductive paste, generally a conductive material being excellent in conductivity such as Ag or a metallic paste is used.

Figure 5:
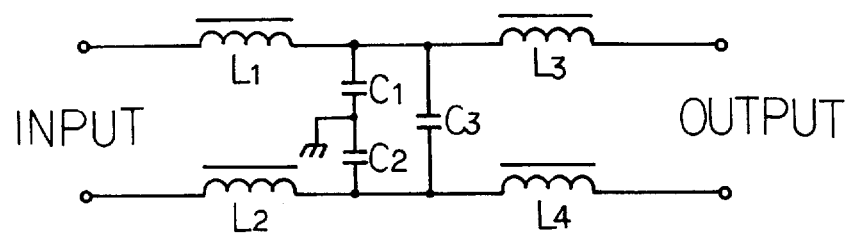
Figure 7:
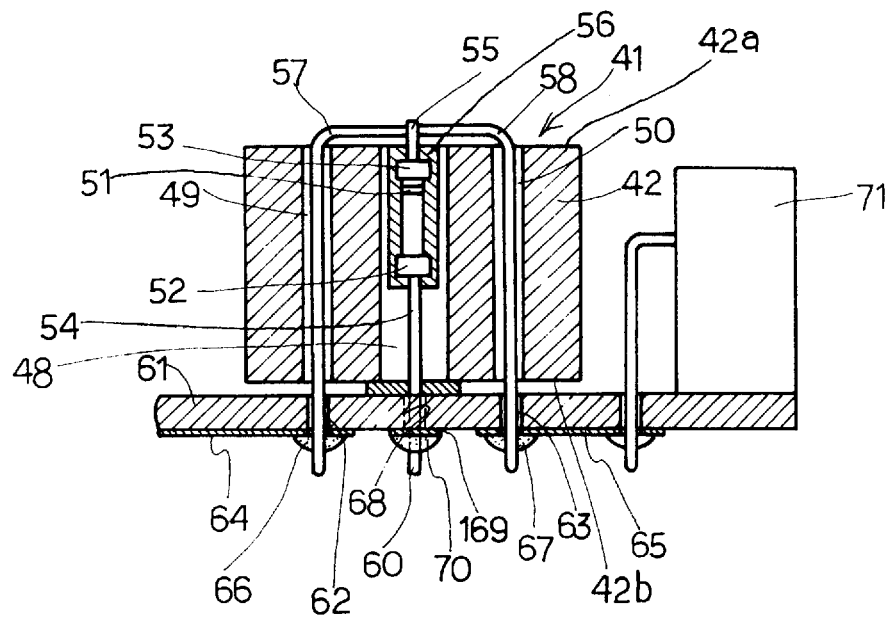
FIG. 7 is a cross sectional view showing an assembled state of a conventional filter assembly.
Figure 6:
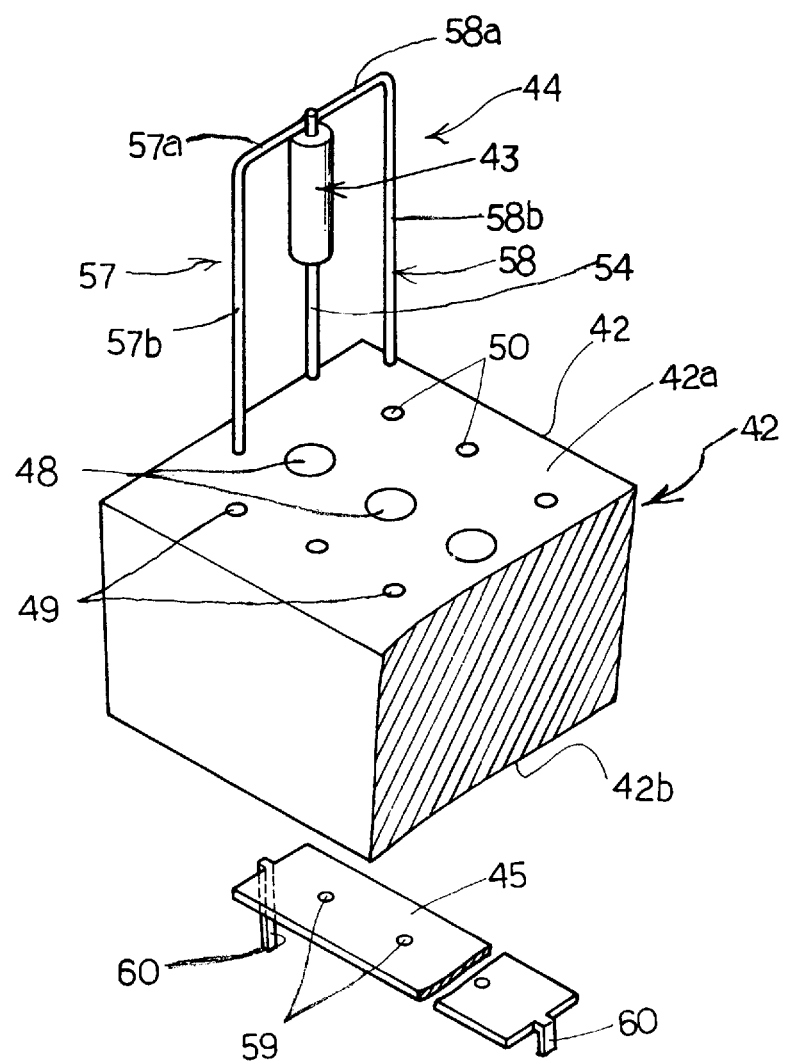
FIG. 6 is an exploded perspective view showing a part of a conventional filter assembly.

FIG. 5 is an equivalent circuit of the line filter for a surface mounting device in accordance with the present invention.

Explaining an operation and effect of the present invention made by a construction as above, it will be as follows.

In FIGS. 1 to 5, the line filter for a surface mounting device in accordance with the present invention can be easily used as a surface mounting device with a small sized magnitude, and which is that a noise characteristic is improved, and it will be described more in detail below.

In FIG. 1, after forming a capacitor mounting portion 11 having a predetermined depth and area by considering a magnitude of the capacitor element to be mounted to top surface of the ferrite core 10 of rectangular shape, the lead passing through openings 12a, 12b, 12c, 12d made of pair are formed in two, i.e., all four passing through openings to downward from circumferential predetermined position of said capacitor mounting portion 11.

Figure 4:
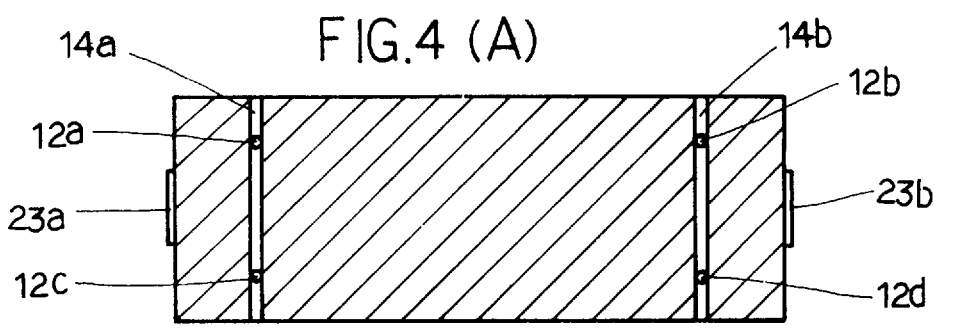
FIGS. 4(A), 4(B) and 4(C) are rear views showing various changed type embodiments for gas discharging paths 14, 14a, 14b of the line filter of a surface mounting device in accordance with the present invention, FIG. 5 equivalent circuit of the line filter for a surface mounting device in accordance with the present invention.
Figure 4:
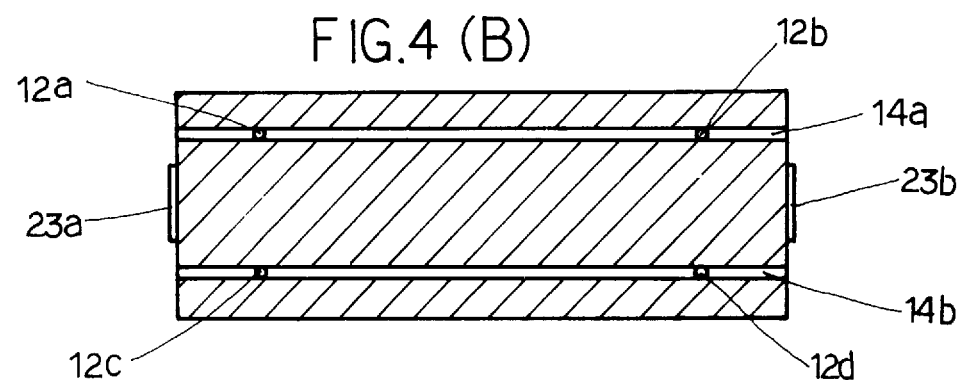
Figure 4:
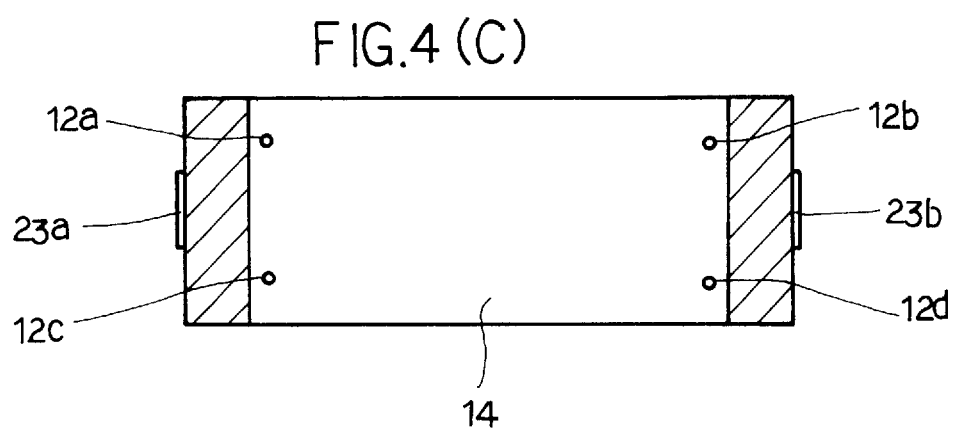

The ground terminal portions 23a, 23b are formed to both side surfaces of the ferrite core 10 by printing a conductive metallic paste such as Ag paste so as to occupy a relatively bigger area than the lead by considering a noise bypassing characteristic, and as shown in FIG. 4, the gas discharging paths 14a, 14b are formed so as to discharge the gas produced upon soldering to a predetermined direction, i.e., breadth-wise direction or lengthwise direction including a portion formed with the lead passing through openings 12a, 12b, 12c, 12d at bottom surface of the ferrite core 10, or the gas discharging path 14 is formed so as to include all of four lead passing through openings 12a, 12b, 12c, 12d.

To the capacitor mounting portion 11 of the ferrite core 10 constructed as above, two bypass capacitors to both side portions and one capacitor to central portion, i.e., three capacitors are mounted to same direction by taking away respectively with predetermined distance, and the front ends of II-shaped lead wire, i.e., the input and output terminals are inserted and passed through the lead wire passing through openings 12a, 12b, 12c, 12d formed at the predetermined position among said three capacitors.

As described above, the three capacitor elements 21a, 21b, 21c mounted on the ferrite core 10, the lead wires 22a, 22b inserted and passed through among them and the ground terminal portions 23a, 23b are soldered whereby electrically connected each other, and then the top surface of the soldering portion is epoxy-coating-processed, so that finally the line filter for a surface mounting device is formed.

Referring the equivalent circuit of the line filter for a surface mounting device in accordance with the present invention shown in FIG. 5 and the ground portion shown in FIG. 1 and FIG. 2, it can be understood that a common noise and normal noise are efficiently eliminated, and since the parts are tightly constructed to the ferrite core, not only the size is greatly reduced, but also the line impedance is improved by a line length reduction according to the tight construction.

By the tight construction, and by a construction widely formed in area than Ag paste lead wires 22*a*, 22*b* to the ground terminal portions 23*a*, 23*b*, a noise bypass characteristic becomes better, and by forming the gas discharging paths 14, 14*a*, 14*b* including a portion formed with the lead passing through openings 12*a*–12*b* to a line form or area form to bottom surface of the ferrite core 10, a gas produced at a process of soldering the lead wire inserted to the passing through opening of the ferrite core is pertinently discharged, so that a close contact of the line filter construction is made to be possible.

As described above, in accordance with the present invention, since entire magnitude of the line filter is greatly reduced, there is particular effect that a mounting can be easily executed, it becomes possible to stably mount, and which improved a noise eliminating characteristic which may be induced along with the power supply line such as common noise and normal noise.

Above description is nothing less than the description for one embodiment of the present invention, and the present invention is possible to have various changes and modifications within extent of its construction.

What is claimed is:

1. A line filter for a surface mounting device, comprising:
    a ferrite core having a top side and a bottom side and having a capacitor mounting portion formed in a top surface thereof, and having a plurality of pairs of lead wire openings extending through from said top side to said bottom side, said ferrite core having a plurality of gas discharge paths extending from a surface of said ferrite core to each of said pairs of openings;
    a multiplicity of capacitor elements each mounted in said mounting portion of the ferrite core and each spaced a distance apart;
    pairs of lead wires each having a pair of legs and a connecting portion connecting said pair of legs said pair of legs extending through a corresponding said pair of openings in said ferrite core, each of said connecting portions being mounted between two of said multiplicity of capacitor elements;
    a soldering portion fixing the capacitors and the pairs of lead wires; and
    an epoxy coating portion coating a surface of said soldering portion.

2. The line filter for a surface mounting device as defined in claim 1, wherein said capacitor mounting portion has a flat surface for mounting said capacitor elements.

3. The line filter for a surface mounting device as defined in claim 1, further including a ground terminal portion.

4. The line filter for a surface mounting device as defined in claim 3, wherein a conductive metallic paste is printed to said ground terminal portion.

5. The line filter for a surface mounting device as defined in claim 4, wherein said ground terminal portion is printed using Ag paste.

6. The line filter for a surface mounting device as defined in claim 3, wherein said ground terminal portion has a width greater than a width of said lead wire openings.

7. The line filter for a surface mounting device as defined in claim 1, wherein at least one gas discharging path extends from said bottom surface of the ferrite core.

8. The line filter for a surface mounting device as defined in claim 7, wherein said gas discharging path(s) are formed in one of a width-wise direction and lengthwise direction.

9. The line filter for a surface mounting device as defined in claim 7, wherein said soldering portion is fixed to said connecting portions of said pairs of lead wires.

\* \* \* \* \*